United States Patent
Konrath et al.

(10) Patent No.: US 9,236,458 B2
(45) Date of Patent: Jan. 12, 2016

(54) BIPOLAR TRANSISTOR AND A METHOD FOR MANUFACTURING A BIPOLAR TRANSISTOR

(71) Applicant: Infineon Technologies AG, Neubiberg (DE)

(72) Inventors: Jens Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 91 days.

(21) Appl. No.: 13/939,358

(22) Filed: Jul. 11, 2013

(65) Prior Publication Data
US 2015/0014704 A1    Jan. 15, 2015

(51) Int. Cl.
*H01L 29/737* (2006.01)
*H01L 29/66* (2006.01)
*H01L 29/732* (2006.01)
*H01L 29/08* (2006.01)

(52) U.S. Cl.
CPC .......... *H01L 29/737* (2013.01); *H01L 29/0821* (2013.01); *H01L 29/66318* (2013.01); *H01L 29/7322* (2013.01)

(58) Field of Classification Search
None
See application file for complete search history.

(56) References Cited

U.S. PATENT DOCUMENTS 6,313,488 B1*   11/2001  Bakowski et al. ............ 257/198
6,693,323 B2     2/2004  Sato et al.
2004/0006592 A1  1/2004  Chang et al.
2008/0211020 A1* 9/2008  Saito .............................. 257/342
2009/0090968 A1* 4/2009  Ono et al. ..................... 257/341
2012/0292636 A1* 11/2012 Zhang et al. .................... 257/77
2012/0292687 A1 11/2012  Lin et al.
2013/0277793 A1* 10/2013 Lee et al. ...................... 257/487

FOREIGN PATENT DOCUMENTS

WO    2010118215 A1   10/2010

OTHER PUBLICATIONS

Deboy, Gerald, Superjunction Devices & Technologies—Benefits and Limitations of a Revolutionary Step in Power Electronics, Sep. 5, 2007, IEEE Trans. Elec. Dev. vol. 57, p. 594-600, Aalborg, Denmark.

* cited by examiner

*Primary Examiner* — Charles Garber
*Assistant Examiner* — Brigitte Paterson
(74) *Attorney, Agent, or Firm* — Murphy, Bilak & Homiller, PLLC (57) ABSTRACT

A bipolar transistor includes a semiconductor structure including an emitter area, a base area and a collector area. The emitter area is electrically connected to an emitter contact of the bipolar transistor. Further, the emitter area has a first conductivity type. The base area is electrically connected to a base contact of the bipolar transistor. Further, the base area has at least mainly a second conductivity type. The collector area is electrically connected to a collector contact of the bipolar transistor and has at least mainly the first conductivity type. Further, the collector area includes a plurality of enclosed sub areas having the second conductivity type or the base area includes a plurality of enclosed sub areas having the first conductivity type.

18 Claims, 3 Drawing Sheets

FIG 4

BIPOLAR TRANSISTOR AND A METHOD FOR MANUFACTURING A BIPOLAR TRANSISTOR

FIELD

Embodiments relate to bipolar junction devices and in particular to a bipolar transistor and a method for manufacturing a bipolar transistor.

BACKGROUND

Nowadays, a large variety of electronic devices is used in many different power and voltage ranges. Such electronic devices often use semiconductor devices in order to implement various electric circuits. These semiconductor devices may resist a voltage of only several Volts or also up to several thousand Volts. Devices with high-blocking voltage (e.g. several thousand Volts) often use bipolar power transistors to switch such large voltages. Bipolar power transistors often comprise a low doping of the collector zone in order to implement their blocking capability. For example, the second breakdown may be avoided by strong limitation of the current density in forward direction (e.g. about 30 A/m$^2$ for a power bipolar junction transistor with a blocking voltage of 4.5 kV). The increase of the blocking voltage and/or the maximal current density of electronic devices is an ongoing desire.

SUMMARY

An embodiment relates to a bipolar transistor comprising a semiconductor structure. The semiconductor structure comprises an emitter area, a base area and a collector area. The emitter area is electrically connected to an emitter contact of the bipolar transistor. Further, the emitter area comprises a first conductivity type. The base area is electrically connected to a base contact of the bipolar transistor. Further, the base area comprises at least mainly a second conductivity type. The collector area is electrically connected to a collector contact of the bipolar transistor. Further, the collector area comprises at least mainly the first conductivity type. Additionally, the collector area comprises a plurality of enclosed sub areas comprising the second conductivity type or the base area comprises a plurality of enclosed sub areas comprising the first conductivity type.

By implementing sub areas of the opposite conductivity type within the collector area or the base area, depletion zones are implemented in the collector area or the base area which relieve a part of the electric field in the blocking state of the bipolar transistor. Therefore, the maximal blocking voltage of the bipolar transistor may be increased and/or the thickness of the collector area can be reduced and/or the dopant concentration of the collector area can be increased in order to reduce the resistance of the bipolar transistor in the on-state.

In some embodiments, an average density of dopants of the first conductivity type within a region of the collector area or the base area enclosing the plurality of enclosed sub areas differs less than 10% from an average density of dopants of the second conductivity type within the region of the collector area or the base area enclosing the plurality of enclosed sub areas. In this way, the amount of free charge carriers of electrons and holes are nearly the same and may nearly compensate each other in a blocking state of the bipolar transistor. Therefore, the blocking voltage may be further increased.

Some embodiments relate to a method for manufacturing a bipolar transistor. The method comprises manufacturing a semiconductor structure comprising an emitter area electrically connected to an emitter contact of the bipolar transistor, a base area electrically connected to a base contact of the bipolar transistor and a collector area electrically connected to a collector contact of the bipolar transistor. The emitter area comprises a first conductivity type, the base area comprises at least mainly a second conductivity type and the collector area comprises at least mainly the first conductivity type. Further, the collector area comprises a plurality of enclosed sub areas comprising the second conductivity type or the base area comprises a plurality of enclosed sub areas comprising the first conductivity type. Additionally, the method comprises manufacturing the emitter contact, the base contact and the collector contact of the bipolar transistor.

In this way, a proposed bipolar transistor can be manufactured with low effort.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
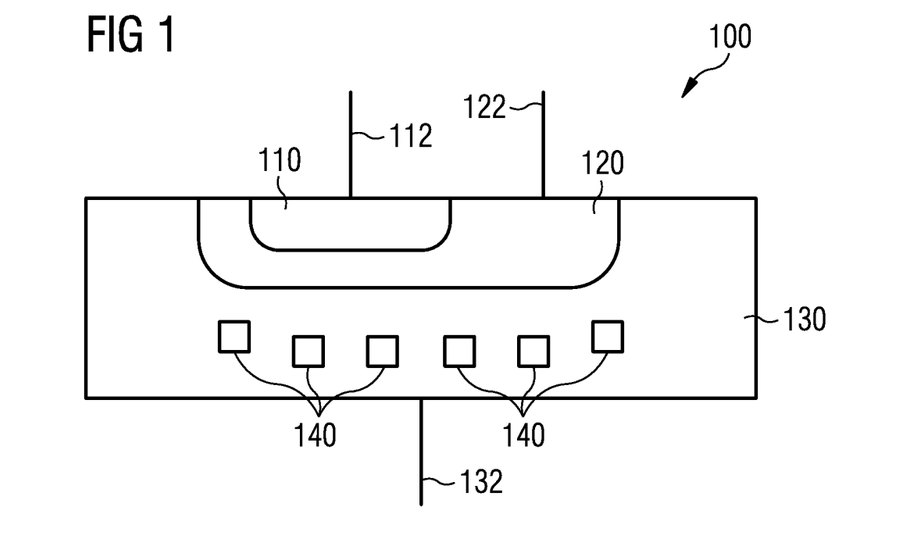
FIG. 1 shows a schematic illustration of a cross section of a bipolar transistor.

FIG. 1 shows a schematic illustration of a bipolar transistor 100 according to an embodiment. The bipolar transistor 100 comprises a semiconductor structure with an emitter area 110, a base area 120 and a collector area 130. The emitter area 110 is electrically connected to an emitter contact 112 of the bipolar transistor 100. Further, the emitter area 110 comprises a first conductivity type (e.g. n- or p-doping). The base area 120 is electrically connected to a base contact 122 of the bipolar transistor 100. Further, the base area 120 comprises at least mainly a second conductivity type (e.g. p- or n-doping). The collector area 130 is electrically connected to a collector contact 132 of the bipolar transistor 100. Further, the collector area 130 comprises at least mainly the first conductivity type (e.g. n- or p-doping). Additionally, the collector area 130 comprises a plurality of enclosed sub areas 140 comprising the second conductivity type (e.g. p- or n-doping) as shown in FIG. 1. Alternatively (or additionally), the base area 120 comprises a plurality of enclosed sub areas (similar to the sub areas shown in the collector area of FIG. 1) comprising the first conductivity type (e.g. n- or p-doping).

By implementing sub areas of the opposite conductivity type within the collector area or the base area, depletion zones are implemented in the collector area or the base area which relieve a part of the electric field in the blocking state of the bipolar transistor. Therefore, the maximal blocking voltage of the bipolar transistor may be increased and/or the thickness of the collector area can be reduced and/or the dopant concentration of the collector area can be increased in order to reduce the resistance of the bipolar transistor in the on-state.

The bipolar transistor 100 (also called bipolar junction transistor) may be an npn-transistor or a pnp-transistor, for example. In other words, the bipolar transistor 100 may comprise an n-doped emitter area, an at least mainly p-doped base area and an at least mainly n-doped collector area or vice versa.

The bipolar transistor 100 may be connected to other electrical elements on the same semiconductor die or may be connected to external electronic devices for various applications.

The semiconductor structure of the bipolar transistor 100 may represent the semiconductor part of the bipolar transistor 100. Additionally, the bipolar transistor 100 may comprise electric contacts (e.g. emitter contact, base contact, collector contact) electrically connected to the semiconductor structure as well as optionally one or more metal layers and one or more insulation layers on top of the semiconductor structure.

The semiconductor structure may be implemented by various semiconductor processing technologies. For example, the semiconductor structure may be a silicon carbide based semiconductor structure (e.g. at least the emitter area, the base area and the collector area comprise silicon carbide), a silicon based semiconductor structure (e.g. at least the emitter area, the base area and the collector area comprise silicon), a gallium arsenide based semiconductor structure (e.g. at least the emitter area, the base area and the collector area comprise gallium arsenide) or a gallium nitride based semiconductor structure (e.g. at least the emitter area, the base area and the collector area comprise gallium nitride). In general, parts of the semiconductor device may be based on any Group-IV semiconductor material or Group IV-IV, III-V or II-VI semiconductor compound materials, e.g. but not limited to Si, SiGe, SiC, GaAs, GaN, InP.

The emitter area 110 and the collector area 130 comprise the first conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

The emitter area 110 is a region of the semiconductor substrate electrically connected (e.g. by an ohmic contact or Schottky contact between semiconductor and front-side power metallization) to an emitter contact 112 (e.g. tungsten, copper, aluminum or another metal contact) and bordered by a pn-junction towards the base area 120. In an operating state of the bipolar transistor 100, the emitter area 110 emits charge carriers through the base area 120 to the collector area 130. The emitter contact 112 may be a metal layer in contact with the emitter area 110 for connecting the emitter area 110 electrically to another electric element on the same semiconductor die or to a pad of the semiconductor die for providing an interface for connecting the emitter area 110 to an external electronic device.

The base area 120 is a region of the semiconductor substrate electrically connected (e.g. by an ohmic contact or Schottky contact between semiconductor and front-side power metallization) to a base contact 122 (e.g. tungsten, copper, aluminum or another metal contact) and bordered by a pn-junction towards the emitter area 110 and the collector area 130. In an operating state of the bipolar transistor 100, the base area 120 controls the current from the emitter area 110 to the collector area 130. The base contact 122 may be a metal layer in contact with the base area 120 for connecting the base area 120 electrically to another electric element on the same semiconductor die or to a pad of the semiconductor die for providing an interface for connecting the base area 120 to an external electronic device.

The base area 120 may comprise mainly the second conductivity type, if the part of the semiconductor structure occupied by the base area 120 comprises a doping of the second conductivity type over more than 50% of the volume, while enclosed sub areas are of the other conductivity type, for example.

The collector area 130 is a region of the semiconductor substrate electrically connected (e.g. by an ohmic contact or Schottky contact between semiconductor and front-side power metallization) to a collector contact 132 (e.g. tungsten, copper, aluminum or another metal contact) and bordered by a pn-junction towards the base area 120. In an operating state of the bipolar transistor 100, the collector area 130 collects charge carriers emitted by the emitter area 110 through the base area 120. The collector contact 132 may be a metal layer in contact with the collector area 130 for connecting the collector area 130 electrically to another electric element on the same semiconductor die or to a pad of the semiconductor die for providing an interface for connecting the collector area 130 to an external electronic device.

The collector area 130 may comprise mainly the first conductivity type, if the part of the semiconductor structure occupied by the collector area 130 comprises a doping of the first conductivity type over more than 50% of the volume, while enclosed sub areas are of the other conductivity type, for example.

The collector area 130 or the base area 120 comprise a plurality of enclosed sub areas 140 of the respective other conductivity type. For example, the plurality of enclosed sub areas 140 contained by the collector area 130 comprises a p-doping, if the collector area 130 comprises an n-doping. The sub areas 140 of the plurality of enclosed sub areas 140 are enclosed or surrounded by the collector area 130 (e.g. isolated from the base area), if the collector area 130 comprises the plurality of enclosed sub areas 140 as shown in FIG. 1. Similarly, the base area 120 may enclose or surround the sub areas of the plurality of enclosed sub areas, if the base area 120 comprises the plurality of enclosed sub areas. Due to the different conductivity types of the sub areas of the plurality of sub areas 140 and the surrounding collector area 130 or base area 120, a pn-junction and consequently a depletion zone develops or is formed between the enclosed sub areas of the plurality of enclosed sub areas and the surrounding base area 120 or collector area 130. In this way, only very few free charge carriers may be available in a blocking state of the bipolar transistor 100 so that a high blocking voltage can be obtained. Alternatively or additionally, a desired blocking voltage may be obtained with a thinner collector area 130 or a higher dopant concentration within the collector area 130 resulting in a lower on-state resistance.

A plurality of enclosed sub areas 140 may be implemented only in the collector area 130 or only in the base area 120. A stronger effect may be obtained by implementing a plurality of enclosed sub areas 140 within the collector area 130 and the base area 120. In other words, the collector area 130 may comprise a plurality of enclosed sub areas 140 comprising the second conductivity type and the base area 120 may comprise a plurality of enclosed sub areas comprising the first conductivity type. In this way, a bipolar transistor with very high blocking voltage may be obtained. However, an implementation of a plurality of enclosed sub areas in the collector area 130 and the base area 120 may increase the on-state resistance so that an implementation of a plurality of enclosed sub areas 140 within the collector area 130 may be sufficient to increase the blocking voltage of the bipolar transistor 100, while keeping the on-state resistance low. In other words, the base area 120 may comprise solely the second conductivity type and the collector area 130 may comprise the plurality of enclosed sub areas 140 as shown in FIG. 1. Further, a switching speed or another switching characteristic (e.g. current flow after device switched off) may be influenced due to a change of the charge carrier balance in the base area 120, for example.

The number of sub areas 140 of the plurality of enclosed sub areas 140, the placement of the sub areas 140, the shape of the sub areas 140, the size of the sub areas 140, the volume occupied by the sub areas 140 and/or the dopant concentration within the sub areas 140 may vary in a wide range. For example, these parameters may be selected dependent on the application or the desired properties of the bipolar transistor 100 (e.g. blocking voltage, on-state resistance).

For example, optionally an average density of dopants of the first conductivity type within a region of the collector area 130 or the base area 120 enclosing the plurality of enclosed sub areas differs less than 10% from an average density of dopants of the second conductivity type within the region of the collector area 130 or the base area 120 enclosing the plurality of enclosed sub areas. The region of the collector area 130 or the base area 120 enclosing the plurality of enclosed sub areas may be a volume (e.g. a cube, a cuboid or sphere) containing all sub areas of the plurality of sub areas. For example, this region may be a cube or a cuboid comprising a minimal volume, while enclosing all sub areas of the plurality of sub areas. In this region enclosing the plurality of sub areas, regions with the first conductivity type (e.g. the collector area) and regions with the second conductivity type (e.g. plurality of sub areas) are located. Therefore, the average density of dopants (e.g. averaged over the minimal volume enclosing all sub areas) of the first conductivity type takes into account the volume ratio between regions of the first conductivity type and the second conductivity type as well as different dopant densities within the regions of the first conductivity type and the second conductivity type. The average density of dopants of the first conductivity type may differ less than 10% (or less than 30%, less than 20%, less than 5% or less than 1%) from the average density of dopants of the second conductivity type. In other words, the number of free charge carriers of the first type (e.g. electrons) differs less than 10% from the number of free charge carriers (e.g. electron holes) within the region of the collector area 130 or the base area 120 enclosing the plurality of enclosed sub areas 140. By implementing the plurality of sub areas 140 within the collector area 130 or the base area 120 with the proposed volume and dopant density ratio, the number of free charge carriers can be kept very low. Therefore, the blocking voltage may be significantly increased.

Optionally, alternatively or additionally to one or more aspects mentioned above, the plurality of enclosed sub areas may occupy less than 50% of the volume of the base area 120 or the collector area 130 containing or enclosing the plurality of enclosed sub areas. For example, the volume containing or enclosing the plurality of enclosed sub areas may be a cube or a cuboid or another geometry with minimal volume, while enclosing the plurality of enclosed sub areas as mentioned above. The plurality of enclosed sub areas may occupy or use less than 50% (or less than 30%, less than 20% or less than 10%) of this volume. In this way, the resistance of the bipolar transistor 100 in an on-state of the bipolar transistor 100 may be kept low, since the plurality of enclosed sub areas (e.g. these areas may not or may only weakly contribute to the current flow) occupies only a small volume.

Optionally, alternatively or additionally to one or more aspects mentioned above, an average dopant density of the plurality of enclosed sub areas 140 is higher than an average dopant density of a region of the collector area 130 or the base area 120 arranged between the plurality of enclosed sub areas. For example, the plurality of enclosed sub areas 140 may be implemented with a higher average dopant density of dopants of the second conductivity type (e.g. averaged over the volume occupied by the plurality of enclosed sub areas) than an average dopant density of dopants of the first conductivity type (e.g. averaged over the volume occupied by the collector area between the plurality of enclosed sub areas) of the region of the collector area arranged between the plurality of enclosed sub areas 140. In other words, the plurality of enclosed sub areas 140 may be implemented with a higher dopant density than the surrounding regions of the collector area 130 or the base area 120. In this way, it may be sufficient to implement small sub areas 140 in order to keep the number of free charge carriers low, since the depletion zone surrounding a sub area 140 may reach far into the surrounding collector area 130 or base area 120 in the blocking state of the bipolar transistor 100.

The sub areas of the plurality of enclosed sub areas may be implemented with various shapes. The sub areas of the plurality of sub areas may comprise all the same shape (e.g. neglecting manufacturing variations) or may comprise at least partly differing shapes.

For example, a cross section of one or more sub areas of the plurality of enclosed sub areas may be rectangular shaped, square shaped, elliptic shaped, circular shaped or may comprise another geometry. For example, at least a part (e.g. more than 30%, more than 50%, more than 80% or all) of the enclosed sub areas 140 of the plurality of enclosed sub areas 140 comprises a vertical dimension (e.g. orthogonal to a main surface of the semiconductor structure) being larger than a lateral dimension (e.g. at least one of two possible lateral dimensions) in a lateral direction (e.g. resulting in vertical columns or vertical plains of sub areas).

A main surface of the semiconductor structure may be a surface of the semiconductor structure towards metal layers, insulation layers or passivation layers on top of the semiconductor structure. In comparison to a basically vertical edge (e.g. resulting from separating the semiconductor dies from others) of the semiconductor structure, the main surface of the semiconductor structure may be a basically horizontal surface. The main surface of the semiconductor structure may be a basically even plane (e.g. neglecting unevenness of the semiconductor structure due to the manufacturing process). In other words, the main surface of the semiconductor structure may be the interface between the semiconductor material and an insulation layer, metal layer or passivation layer on top of the semiconductor substrate.

Figure 2A:
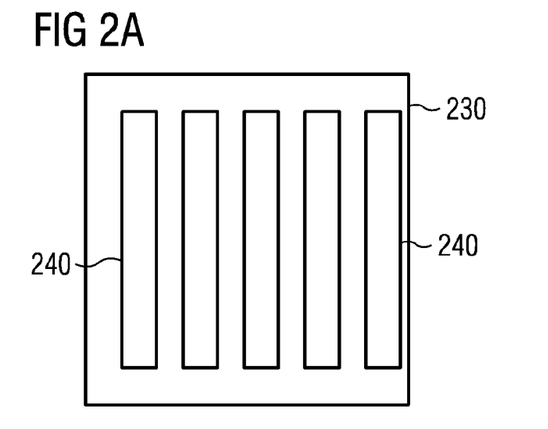
FIG. 2a, 2b, 2c show schematic cross sections of possible collector areas.

An example of a collector area 230 with such column-shaped or pillar-shaped sub areas 240 is shown in the schematic cross section of FIG. 2a. The base area may be arranged on top of the collector area 230 and a substrate layer of the collector area or a collector contact may be arranged below the illustrated collected area 230. In this way, the sub areas 240 may be aligned to a current flow direction from the emitter area through the base area to the collector contact in order to keep the on-state resistance low.

Alternatively or additionally, at least a part of the enclosed sub areas of the plurality of enclosed sub areas may be basically ball shaped or sphere shaped.

Figure 2B:
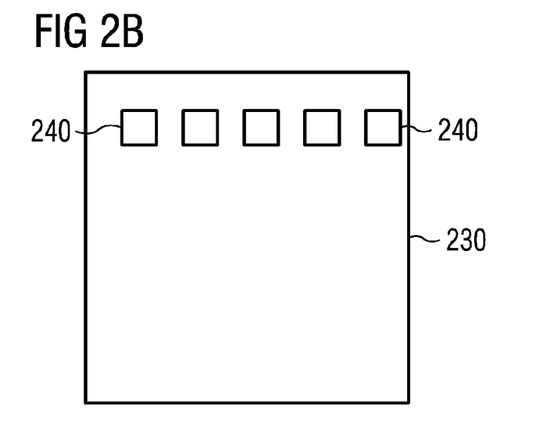

Further, alternatively or additionally, at least a part of the enclosed sub areas of the plurality of enclosed sub areas may comprise a basically (e.g. neglecting deviations due to manufacturing) rectangular, square shaped or elliptic cross section. An example for square shaped sub areas 240 within the collector area 230 is shown in FIG. 2b.

Additional to various possible cross sections, the sub areas may comprise also various possible footprints (e.g. cross section parallel to the main surface of the semiconductor structure). For example, at least a part of the enclosed sub areas of the plurality of enclosed sub areas may comprise a basically rectangular, circular or elliptic footprint.

The collector area 130 may be implemented in various ways. For example, the collector area 130 may comprise a substrate layer with the first dopant density and a drift layer with a second dopant density. The drift layer may be arranged between the substrate layer and the base area 120 and the first dopant density may be higher than the second dopant density. Due to the low dopant density of the drift layer, a bipolar transistor 100 with high blocking voltage may be provided, since only few free charge carriers may be available in the drift region. Due to the high dopant density of the substrate layer, a good contact (e.g. ohmic contact) to a metal layer representing the collector contact 132 may be provided. Further, the plurality of enclosed sub areas 140 may be located within the drift layer so that the number of free charge carriers within the drift layer can be further reduced.

Alternatively, additionally or optionally to one or more aspects mentioned above, at least a part of the enclosed sub areas 140 of the plurality of enclosed sub areas 140 may extend from the drift layer into the substrate layer of the collector layer 130. In this way, the density of free charge carriers in a region of the substrate layer close to the drift layer can be reduced so that the electric field can be further reduced in this area of the substrate layer.

Additionally, alternatively or optionally to one or more aspects mentioned above, the collector area 130 may further comprise a field stop layer arranged between the drift layer and the substrate layer. The field stop layer may comprise a third dopant density between the first dopant density of the substrate layer and the second dopant density of the drift layer. In this way, the density of free charge carriers can be already reduced in the field stop layer in comparison to the substrate layer so that the field can be reduced by the field stop layer. Alternatively, the field stop layer may comprise a dopant gradient or may comprise consecutive layers with increasing dopant concentration, for example.

Figure 2C:
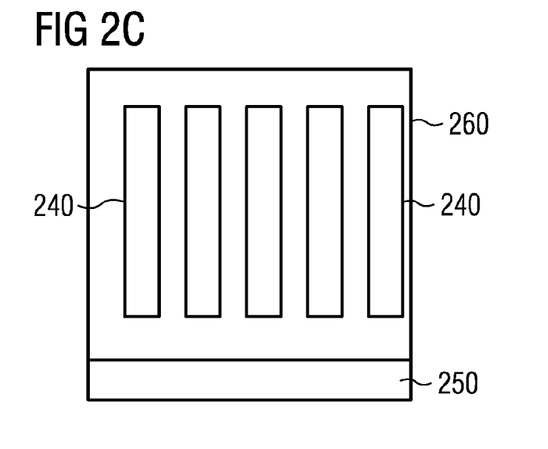

FIG. 2c shows a schematic illustration of a drift layer 260 with a plurality of enclosed sub areas 240 on top of a field stop layer 250. The substrate layer below the field stop layer 250 is not shown. Additionally, alternatively or optionally, at least a part of the enclosed sub areas 240 of the plurality of enclosed sub areas 240 may extend from the drift layer 260 through the field stop layer 250 into substrate layer, for example.

The emitter area 110, the base area 120 and the collector area 130 can be arranged in various ways. However, the base area 120 separates the emitter area 110 from the collector area 130 and a pn-junction exists between the emitter area 110 and the base area 120 as well as between the base area 120 and the collector area 130.

For example, the emitter area 110, the base area 120 and the collector area 130 may be arranged at least partly (e.g. in a region used for more than 50% of the current flow in an on-state of the bipolar transistor) in a vertically stacked manner (or alternatively in a lateral stacked manner). In other words, the emitter area 110, the base area 120 and the collector area 130 may be arranged so that more than 50% (or more than 70% or more than 90%) of the current between the emitter area 110 and the collector area 130 flows in a vertical direction (orthogonal to the main surface of the semiconductor structure).

The emitter area 110, the base area 120 and the collector area 130 may be implemented by different semiconductor layers deposited (e.g. epitaxic) on each other. Alternatively, the emitter area 110, the base area 120 and the collector area 130 may be at least partly or mainly manufactured within a common semiconductor layer of the semiconductor structure (e.g. by implanting ions of different conductivity types).

Figure 3:
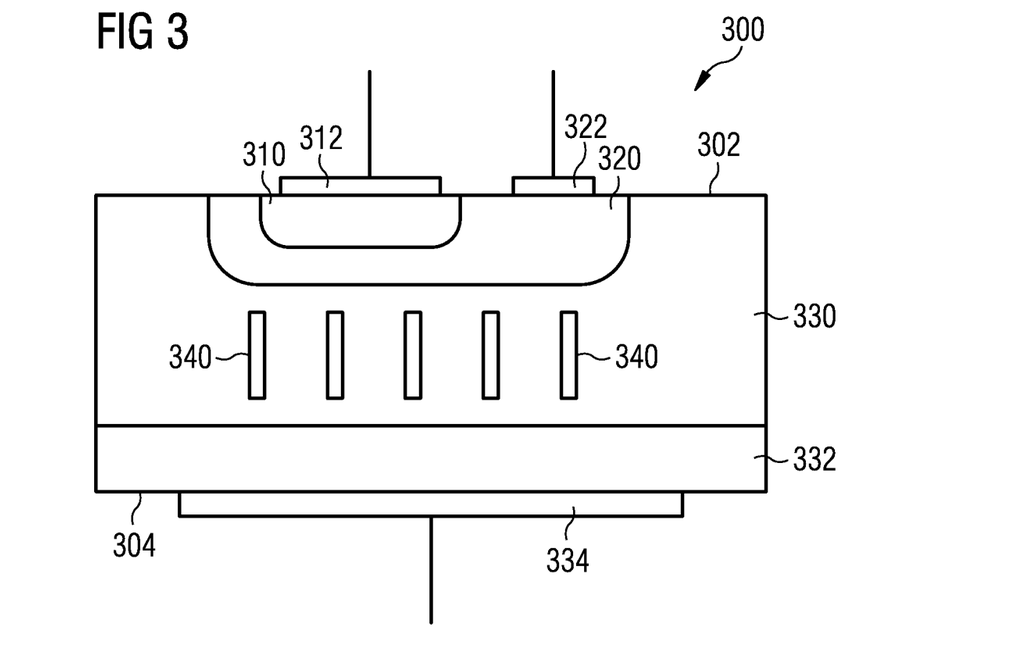
FIG. 3 shows a schematic illustration of a cross section of a bipolar transistor.

FIG. 3 shows a schematic illustration of a bipolar transistor 300 according to an embodiment. The structure of the bipolar transistor 300 is similar to the bipolar transistor shown in FIG. 1. The emitter area 310 is electrically connected to an emitter contact 312 of the bipolar transistor 300 arranged at the first side 302 of the semiconductor structure (e.g. main surface). Further, the base area 320 is electrically connected to a base contact 322 of the bipolar transistor 300 arranged at the first side 302 of the semiconductor structure as well. Additionally, the collector area is electrically connected to a collector contact 334 of the bipolar transistor 300 arranged at a second side 304 of the semiconductor structure opposite to the first side 302 of the semiconductor structure. In this example, the collector area comprises a drift layer 330 comprising the plurality of sub areas 340 and a substrate layer 332 as already mentioned. For example, the emitter area 310 comprises a high n-doping, the base area 320 comprises a p-doping, the drift layer 330 comprises a low n-doping, the substrate layer 332 comprises a high n-doping and the plurality of sub areas 340 comprises a p-doping. The emitter area 310, the base area 320 and the substrate layer 332 may comprise a very high dopant density in the proximity of the respective metal contact in order to implement a good ohmic contact (e.g. with reduced Schottky effect), for example.

Some embodiments relate to a bipolar transistor comprising a blocking voltage of more than 100V, more than 500V, more than 1000V, more than 2000V, more than 4000V or even more. Such a bipolar transistor may be implemented according to the described concept or one or more embodiments described above.

For example, a power semiconductor switch with reduced forward voltage drop (or reduced on-state resistance) and increased blocking capability may be implemented. For this, a Super-Junction (a plurality of sub areas) may be implemented in order to allow to increase the dopant concentration in the collector zone (collector area) and in order to increase the static and dynamic robustness of the device. For this, opposite doped areas (plurality of sub areas) may be incorporated in the lightly doped collector zone. For example, the doping concentration may be selected so that the lateral integral of the doping concentration of the p-doped and the n-doped regions are basically equal (e.g. differ less than 10%) and lie in the range of the breakdown charge of the respective semiconductor material (e.g. n-doping concentration of the collector area between $5*10^{14}$ and $10^{17}$, more preferred in a range of $5*10^{15}$ and $5*10^{16}$ silicon carbide device or $10^{13}$ to $10^{14}$ for a 1200V silicon device). Optionally, the compensation areas (the plurality of sub areas) may be located in a distance or separated from the highly doped collector zone (substrate layer) or they may also extend at least partly into the highly doped zone. Some possible structures or design alternatives are shown in FIG. 2a-2c. FIGS. 2a-2c illustrate examples of a bipolar transistor with columns or islands of the opposite conductivity type (FIGS. 2a and 2b). Further, a field stop can be implemented at the border between collector (drift layer) and substrate (substrate layer) of the collector. The blocking capability may be kept, since the cleared depletion zones between the p-doped and n-doped columns may absorb or reduce (at least a part) the electric field in a blocking state. Therefore, a thinner collector zone or a higher doped collector zone can be implemented with the same blocking capability, for example. Additionally, the specific resistance of the collector zone and in this way the voltage drop of the device in an on-state can be reduced due to the higher dopant concentration of the collector zone and/or the reduced vertical dimension or extension of the lightly doped zone.

The p-doped and n-doped compensations columns (example for plurality of sub areas) may comprise a rectangular (i.e. band shaped) or an elliptic footprint or may be implemented as spheres within the collector zone.

The proposed semiconductor switch comprises no gate oxide on the base area in comparison to an Isolated Gate Bipolar Transistor (IGBT), for example. The base zone (base area) may be directly connected (e.g. electrically connected to a base contact). Therefore, reliability issues due to the stability of the oxide may be avoided, for example.

A bipolar transistor or a switch may be implementable or may be manufactured in various semiconductor materials (e.g. silicon carbide, gallium arsenide, gallium nitride or silicon).

An aspect is the implementation of a bipolar power semiconductor switch with the collector zone comprising entirely or at least partly alternating p- and n-columns or also differently shaped compensation areas (or consist of). The cleared depletion zone of the columns takes a part of the electric field in a blocking state in this case, for example.

For example, the forward voltage drop of the transistor may be further reduced by a large lateral expansion or extension of the current-carrying areas (collector area surrounding the plurality of sub areas) in comparison to the compensation areas (plurality of sub areas), for example.

A pnp-transistor may be implemented analogue by exchanging the conductivity types mentioned above.

The collector zone can be implemented with the field stop at the border to the substrate by epitaxy.

Optionally, additional compensation areas may be integrated in the p-base zone of the transistor in order to further increase the blocking capability of the transistor, for example.

Figure 4:
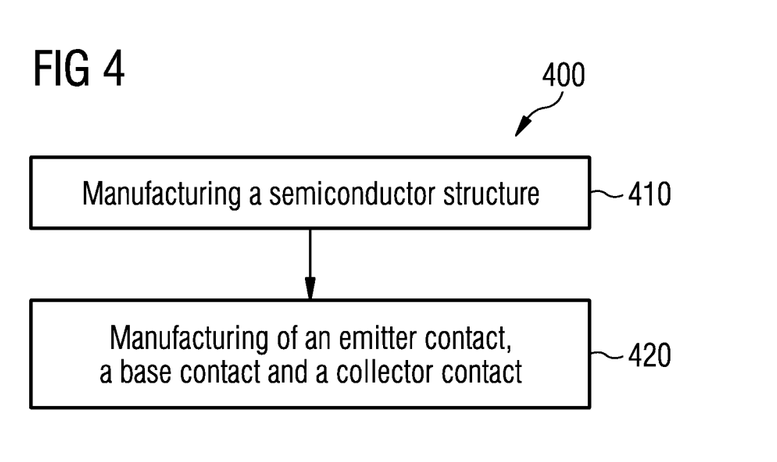
FIG. 4 shows a flow chart of a method for manufacturing a bipolar transistor.

FIG. 4 shows a flow chart of a method 400 for manufacturing a bipolar transistor according to an embodiment. The method 400 comprises manufacturing 410 a semiconductor structure comprising an emitter area electrically connected to an emitter contact of the bipolar transistor, a base area electrically connected to a base contact of the bipolar transistor and a collector area electrically connected to a collector contact of the bipolar transistor. The emitter area comprises the first conductivity type, the base area comprises at least mainly a second conductivity type and the collector area comprises at least mainly the first conductivity type. Further, the collector area comprises a plurality of enclosed sub areas comprising the second conductivity type or the base area comprises a plurality of enclosed sub areas comprising the first conductivity type. Further, the method 400 comprises manufacturing 420 the emitter contact, the base contact and the collector contact of the bipolar transistor.

In this way a proposed bipolar transistor can be easily manufactured.

Optionally, the plurality of enclosed sub areas may be manufactured by a masked implantation (of ions of the opposite conductivity type into the collector area or the base area), a masked diffusion or an epitaxic filling of trenches.

For example, p-doped and n-doped columns may be manufactured by a masked implantation in combination with a suitable following high temperature process, masked diffusion steps or an epitaxic filling of trenches (e.g. for silicon carbide devices).

For semiconductor substrates being based on silicon carbide, the method 400 may comprise depositing of a silicon carbide drift layer of the collector area on top of the silicon carbide substrate layer of the collector area and etching a plurality of trenches into the drift layer. Further, the method 400 may comprise filling the plurality of trenches with material comprising the second conductivity type so that the plurality of enclosed sub areas is obtained within the plurality of trenches. Additionally, the method may comprise depositing a silicon carbide layer comprising the second conductivity type representing the base area on top of the drift layer and depositing a silicon carbide layer comprising the first conductivity type representing the emitter area on top of the base area.

Optionally, the depositing of a silicon carbide drift layer, etching trenches and filling the trenches with material comprising the second conductivity type can be repeated in order to manufacture a drift layer with arbitrary thickness, for example.

For example, the manufacturing of a silicon carbide npn-bipolar junction transistor with Super-Junction zones (SJ zones) may be possible. The collector zone may be deposited epitaxially on the substrate material and trenches may be etched into this layer. Then, these trenches may be filled with p-doped silicon carbide by epitaxy. These steps can be repeated once or several times in order to manufacture a collector zone with large thickness. Afterwards the p-basis and the n-emitter may be deposited epitaxially. After etching a trench for uncovering the base zone, the base zone can be connected. The trenches may be refilled with an insulator and the emitter can be provided with metal contacts. Then, the front side metallization can be deposited and structured.

Alternatively, for semiconductor substrates being a silicon carbide based substrate, the method 400 may comprise depositing of a silicon carbide drift layer of the collector area on top of a silicon carbide substrate layer of the collector area and etching a plurality of trenches into the drift layer. Further, the method 400 may comprise manufacturing the plurality of enclosed sub areas by a tilted implantation of the plurality of trenches with dopants of the second conductivity type or a plasma deposition doping of the plurality of trenches with dopants of the second conductivity type. Further, the method 400 may comprise filling the plurality of trenches with material comprising the first conductivity type so that the plurality of enclosed sub areas is obtained within the plurality of trenches. Additionally, the method 400 may comprise depositing a silicon carbide layer comprising the second conductivity type representing the base area on top of the drift layer and depositing a silicon carbide layer comprising the first conductivity type representing the emitter area on top of the base area.

In an example, the trenches manufactured by trench etching are doped by a tilted implantation or by a plasma deposition method and then the trenches are filled with the respective semiconductor material. For this, the semiconductor material used for filling comprises the same doping type and optionally also nearly the same dopant concentration as the epitaxially deposited collector zone or can be doped relatively low, for example.

Small compensation areas may be manufactured by using the described method with silicon carbide material, since the diffusion constant of dopants in the silicon carbide material is very low.

Optionally, alternatively or additionally to one or more aspects mentioned above, the contact areas (of the emitter area, the base area and/or the collector area) for metal deposition may be implemented with high dose implantation of the same species as the area to be conducted in order to manufacture ohmic contacts, for example.

The method 400 may comprise one or more further optional acts implementing one or more of the aspects mentioned in connection with the proposed concept or one or more embodiments described above.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F) PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A bipolar transistor comprising a semiconductor structure, the semiconductor structure comprising:
   an emitter area electrically connected to an emitter contact of the bipolar transistor, wherein the emitter area comprises a first conductivity type;
   a base area electrically connected to a base contact of the bipolar transistor, wherein the base area comprises a second conductivity type; and
   a collector area electrically connected to a collector contact of the bipolar transistor, wherein the collector area comprises the first conductivity type;
   wherein the collector area encloses sub areas comprising the second conductivity type or the base area encloses sub areas comprising the first conductivity type,
   wherein an average density of dopants of the first conductivity type within a region of the collector area enclosing the plurality of enclosed sub areas differs less than 10% from an average density of dopants of the second conductivity type within the plurality of enclosed sub areas or an average density of dopants of the second conductivity type within a region of the base area enclosing the plurality of enclosed sub areas differs less than 10% from an average density of dopants of the first conductivity type within the plurality of enclosed sub areas.

2. The bipolar transistor according to claim 1, wherein the plurality of enclosed sub areas occupies less than 50% of a volume of the base area or the collector area containing the plurality of enclosed sub areas.

3. The bipolar transistor according to claim 1, wherein an average dopant density of the plurality of enclosed sub areas is higher than an average dopant density of a region of the base area or the collector area arranged between the plurality of enclosed sub areas.

4. The bipolar transistor according to claim 1, wherein at least a part of the enclosed sub areas of the plurality of enclosed sub areas comprises a vertical dimension being larger than a lateral dimension in a lateral direction or at least one enclosed sub area of the enclosed sub areas of the plurality of enclosed sub areas is ball-shaped.

5. The bipolar transistor according to claim 1, wherein at least a part of the enclosed sub areas of the plurality of enclosed sub areas comprises a rectangular, circular or elliptic footprint.

6. The bipolar transistor according to claim 1, wherein the base area comprises solely the second conductivity type and the collector area comprises the plurality of enclosed sub areas.

7. The bipolar transistor according to claim 1, wherein the collector area comprises a plurality of enclosed sub areas comprising the second conductivity type and the base area comprises a plurality of enclosed sub areas comprising the first conductivity type.

8. The bipolar transistor according to claim 1, wherein the collector area comprises a substrate layer with a first dopant density and a drift layer comprising a second dopant density, wherein the drift layer is arranged between the substrate layer and the base area, wherein the first dopant density is higher than the second dopant density, wherein the plurality of enclosed sub areas is located within the drift layer.

9. The bipolar transistor according to claim 8, wherein at least a part of the enclosed sub areas of the plurality of enclosed sub areas extends from the drift area into the substrate area.

10. The bipolar transistor according to claim 8, wherein the collector area further comprises a field stop layer arranged between the drift layer and the substrate layer, wherein the field stop layer comprises a third dopant density between the first dopant density and the second dopant density.

11. The bipolar transistor according to claim 1, wherein the emitter area, the base area and the collector area are at least partly arranged in a vertically stacked manner.

12. The bipolar transistor according to claim 1, wherein the emitter area, the base area and the collector area are at least partly manufactured within a common semiconductor layer of the semiconductor structure.

13. The bipolar transistor according to claim 1, wherein the emitter area is electrically connected to an emitter contact of the bipolar transistor arranged at a first side of the semiconductor structure, wherein the base area is electrically connected to a base contact of the bipolar transistor arranged at the first side of the semiconductor structure, wherein the collector area is electrically connected to a collector contact of the bipolar transistor arranged at a second side of the semiconductor structure opposite to the first side of the semiconductor structure.

14. The bipolar transistor according to claim 1, comprising a blocking voltage of more than 500V.

15. The bipolar transistor according to claim 1, wherein the semiconductor structure is a silicon carbide based semiconductor structure, a silicon based semiconductor structure, a gallium arsenide based semiconductor structure or a gallium nitride based semiconductor structure.

16. A method for manufacturing a bipolar transistor, the method comprising:
   manufacturing a semiconductor structure comprising an emitter area electrically connected to an emitter contact of the bipolar transistor, a base area electrically connected to a base contact of the bipolar transistor and a collector area electrically connected to a collector contact of the bipolar transistor, wherein the emitter area, the base area and the collector area are arranged in a semiconductor substrate;
   wherein the semiconductor substrate is a silicon carbide based substrate;
   wherein the emitter area comprises a first conductivity type, wherein the base area comprises a second conductivity type, wherein the collector area comprises the first conductivity type;
   wherein the collector area encloses sub areas comprising the second conductivity type;
   manufacturing the emitter contact, the base contact and the collector contact of the bipolar transistor; and
   wherein the manufacturing of the semiconductor structure comprises:
      depositing of a silicon carbide drift layer of the collector area on top of a silicon carbide substrate layer of the collector area;
      etching a plurality of trenches into the drift layer;

manufacturing the plurality of enclosed sub areas by a tilted implantation of the plurality of trenches with dopants of the second conductivity type or a plasma deposition doping of the plurality of trenches with dopants of the second conductivity type;

filling the plurality of trenches with material comprising the first conductivity type so that the plurality of enclosed sub areas is obtained within the plurality of trenches;

depositing a silicon carbide layer comprising the second conductivity type representing the base area on top of the drift layer; and depositing a silicon carbide layer comprising the first conductivity type representing the emitter area on top of the base area.

17. The method according to claim 16, wherein the plurality of enclosed sub areas is manufactured by a masked implantation, a masked diffusion or an epitaxic filling of trenches.

18. A bipolar transistor comprising a semiconductor structure, the semiconductor structure comprising:

an emitter area electrically connected to an emitter contact of the bipolar transistor, wherein the emitter area comprises a first conductivity type;

a base area electrically connected to a base contact of the bipolar transistor, wherein the base area comprises a second conductivity type; and a collector area electrically connected to a collector contact of the bipolar transistor, wherein the collector area comprises the first conductivity type;

wherein the collector area encloses sub areas comprising the second conductivity type and the base area encloses sub areas comprising the first conductivity type.

* * * * *